(12) United States Patent
Mccullagh

(10) Patent No.: US 12,512,753 B2
(45) Date of Patent: Dec. 30, 2025

(54) ENERGY HARVESTING CIRCUITS

(71) Applicant: Creathadh LLC, Cedar Falls, IA (US)

(72) Inventor: James John Mccullagh, Cedar Falls, IA (US)

(73) Assignee: Creathadh LLC, Ann Arbor, MI (US)

( * ) Notice: Subject to any disclaimer, the term of this patent is extended or adjusted under 35 U.S.C. 154(b) by 0 days.

(21) Appl. No.: 18/726,722

(22) PCT Filed: Jan. 5, 2023

(86) PCT No.: PCT/US2023/010219
§ 371 (c)(1),
(2) Date: Jul. 3, 2024

(87) PCT Pub. No.: WO2023/133210
PCT Pub. Date: Jul. 13, 2023

(65) Prior Publication Data
US 2024/0388215 A1    Nov. 21, 2024

Related U.S. Application Data

(60) Provisional application No. 63/296,838, filed on Jan. 5, 2022.

(51) Int. Cl.
*H02M 3/07* (2006.01)
*H02M 7/10* (2006.01)

(52) U.S. Cl.
CPC ............ *H02M 3/07* (2013.01); *H02M 3/072* (2021.05); *H02M 7/103* (2013.01)

(58) Field of Classification Search
USPC ............. 307/110; 327/536; 363/59–61
See application file for complete search history.

(56) References Cited

U.S. PATENT DOCUMENTS

| | | | | |
|---|---|---|---|---|
| 5,499,183 A | * | 3/1996 | Kobatake | H02M 3/073 363/59 |
| 6,133,764 A | * | 10/2000 | Griffith | H03K 5/2472 327/65 |

(Continued)

OTHER PUBLICATIONS

International Search Report and Written Opinion for International Application No. PCT/US2023/010219, dated Jun. 27, 2023.

(Continued)

*Primary Examiner* — Thomas J. Hiltunen
(74) *Attorney, Agent, or Firm* — Young Basile Hanlon & MacFarlane, P.C.

(57) ABSTRACT

Systems and methods are disclosed for energy harvesting circuits. For example, an apparatus (e.g., an integrated circuit) includes a first PMOS transistor with a source terminal connected to an output of an AC-DC charge pump and a drain terminal connected to a first node; a second PMOS transistor with a source terminal connected to the output of the AC-DC charge pump and a drain terminal connected to an output node; a first NMOS transistor with a gate terminal connected to the first node, a source terminal connected to a first input node, and a drain terminal connected to the first node; a second NMOS transistor with a gate terminal connected to the first node, a source terminal connected to a second input node, and a drain terminal connected to the output node; and a switch connected between the second input node and a ground node.

20 Claims, 13 Drawing Sheets

(56) References Cited

U.S. PATENT DOCUMENTS

| | | | |
|---|---|---|---|
| 8,044,704 B2 * | 10/2011 | Chaoui | H02M 3/073 |
| | | | 327/535 |
| 9,276,463 B2 | 3/2016 | Fleming | |
| 10,250,235 B2 * | 4/2019 | Najafi | H02M 7/217 |
| 10,826,386 B2 * | 11/2020 | Liu | H03K 17/06 |
| 2014/0268936 A1 | 9/2014 | Lu et al. | |
| 2017/0155379 A1 | 6/2017 | Najafi et al. | |
| 2017/0324349 A1 | 11/2017 | Paulos et al. | |

OTHER PUBLICATIONS

James McCullagh, "An Active Diode Full-Wave Charge Pump for Low Acceleration Infrastructure-Based Non-Periodic Vibration Energy Harvesting," IEEE Transactions on Circuits and Systems I: Regular Papers, vol. 65, pp. 1758-1770, 2018.

E. Dallago, D. Miatton, G. Venchi, V. Bottarel, G. Frattini, G. Ricotti, and M. Schipani, "Active self supplied AC-DC converter for piezoelectric energy scavenging systems with supply independent bias," in IEEE International Symposium on Circuits and Systems, ISCAS 2008., pp. 1448-1451, 2008.

Chen Po-Hung, K. Ishida, Zhang Xin, Y. Okuma, Y. Ryu, M. Takamiya, and T. Sakurai, "A 120-mV input, fully integrated dual-mode charge pump in 65-nm CMOS for thermoelectric energy harvester," in 2012 17th Asia and South Pacific Design Automation Conference (ASP-DAC), pp. 469-470, 2012.

Shuo Chen, Rutvik Sathe, Raj Dayal Natarajan, David P Arnold, "A Voltage-Multiplying Self-Powered AC/DC Converter with 0.35 V Minimum Input Voltage for Energy Harvesting Applications," 2011; 18 pages.

* cited by examiner

Out Switches if
$In_1 > In_2 + V_{SW\_th}$

If $V_{DC-DC} > V_{charge\_pump\_out}$, then $V_{SW\_th} > V_{SW\_th\_2}$

Out Switches if $In_1 > In_2 + V_{SW\_th\_2}$

ENERGY HARVESTING CIRCUITS

CROSS-REFERENCE TO RELATED APPLICATION(S)

This application claims priority to and the benefit of U.S. Provisional Patent Application Ser. No. 63/296,838, filed Jan. 5, 2022, the entire disclosure of which is hereby incorporated by reference.

TECHNICAL FIELD

This disclosure relates to energy harvesting circuits.

BACKGROUND

This research builds on the previous design completed by James McCullagh during his PhD research at the University of Michigan that was published (see James McCullagh, "An Active Diode Full-Wave Charge Pump for Low Acceleration Infrastructure-Based Non-Periodic Vibration Energy Harvesting," IEEE Transactions on Circuits and Systems I: Regular Papers, vol. 65, pp. 1758-1770, 2018.) and patented (see Khalil Najafi, Rebecca L Peterson, and James John Mccullagh, "Full-Wave Charge Pump With Low-Voltage Startup," U.S. Patent 2017/0155379, Jun. 1, 2017.). The previous design shown in FIG. 1 shows a full wave active diode charge pump with a unique start-up methodology able to allow an AC voltage input to produce a DC voltage input at record low voltages for CMOS for a higher current load. Originally, this design allowed full start-up to higher voltages from and input of ~220 mV to hardware.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1:
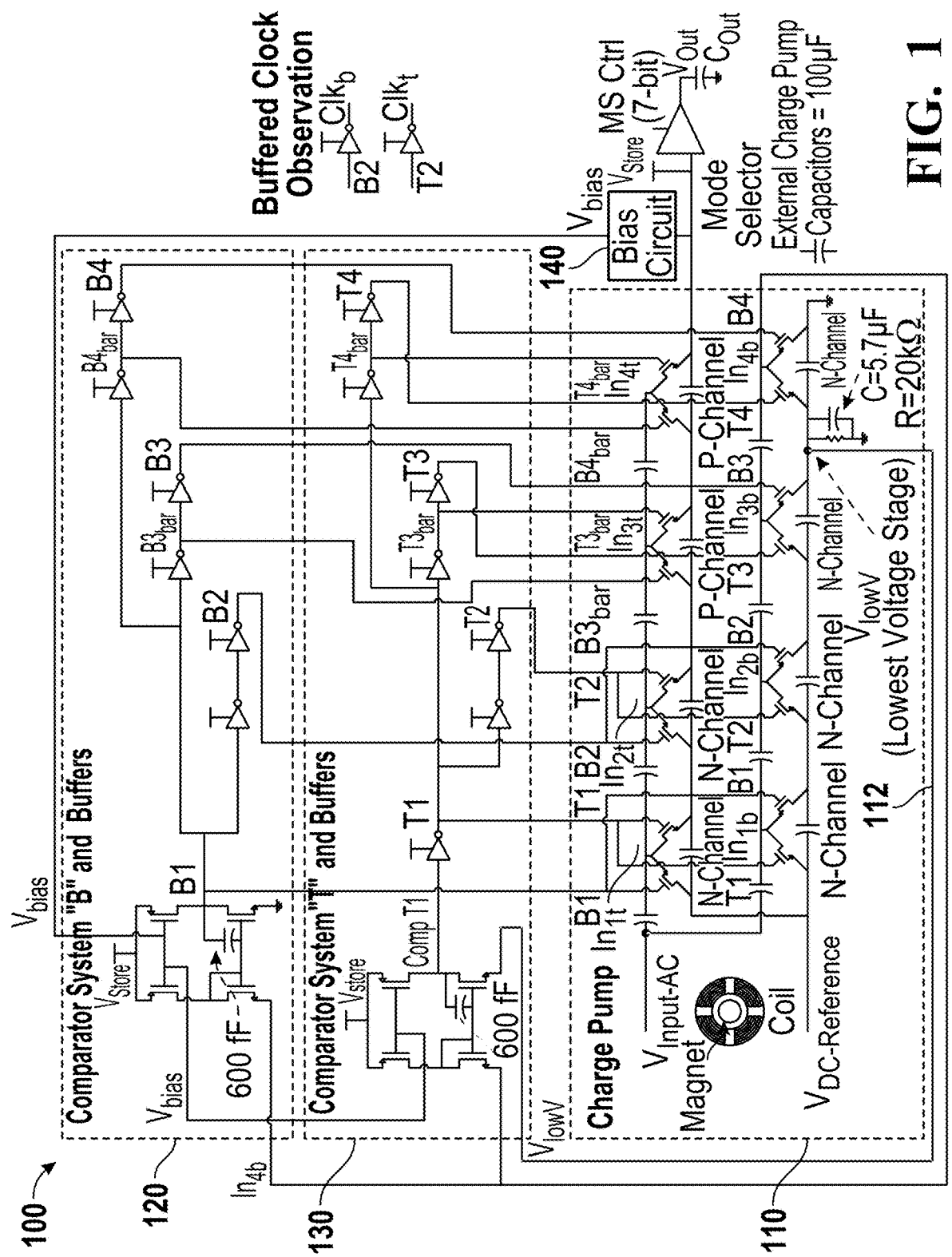
FIG. 1 is a block diagram of an example of an apparatus for energy harvesting.

Described herein are systems and methods for energy harvesting from small AC voltage signals (e.g., a voltage signal from a piezo electric harvester). For example, these systems and methods may be used for vibration harvested energy applications. In some implementations, integrated circuit-based technology focused on a unique method to start-up and harvest low power vibrations is used. The technical criteria described herein may focus on new integrated circuit designs, and how a system including a piezo electric harvester was built to meet the needs of an example product. One example of such a proposed application is a sensor-based orthotic using energy harvesting that would detect ulcer formation in people with diabetes with the goal of preventing amputation.

Integrated circuit designs for a charge pump are described herein. For example, a design criterion may include improving the minimum start-up voltage in simulation to 250 mV using 10 µF capacitors. Better results were seen in hardware near 220 mV, in part, because higher capacitance (e.g., 100 µF) could be used. A 100 µF capacitor was not possible to simulate based on simulation constraints. Both the previous research from the University of Michigan and later research were completed in 180 nm CMOS TSMC technology. This technology was chosen for several reasons, such as, reliability, cost, and low production delays.

Systems described herein may utilize one or more improvements over prior systems including, for example, a switch configured to selectively hold down a voltage at an input node of the comparator when an output of an AC-DC charge pump is above a threshold voltage; one or more PMOS transistors that connect an output of a DC-DC charge pump driven by an AC-DC charge pump to nodes of a comparator; and control circuitry for a DC-DC charge pump that includes two oscillators, with one oscillator connected directly to an output voltage on an AC-DC charge pump and the other oscillator driven by a voltage across a capacitor, that are selectively applied to clock the DC-DC charge pump.

Some implementations may provide advantages over conventional systems for energy harvesting, such as, for example, reducing start-up time for energy harvesting device; reducing the size of capacitors needed in an energy harvesting device; and/or enabling start-up from lower AC voltage sources. For example, a fabricated integrated circuit may measure about 3.7 mm×3.7 mm. The largest component by far may be the Dickson charge pump capacitors. Generally, this significantly increases the size of the integrated circuit so the fill requirements could be met (e.g., metals 1-6). The Dickson charge pump capacitors may surround both the circuitry for the AC-DC charge pump and DC-DC charge pump.

As used herein, the phrase "current source" refers to an electronic circuit or component thereof that is configured to deliver or absorb an electric current independent of an electric voltage applied to it. A "current source" may be configured as a "current sink" when connected to a negative voltage supply or ground. Further, as used herein, the term "circuitry" refers to an arrangement of electronic components (e.g., transistors, resistors, capacitors, and/or inductors) that is structured to implement one or more functions. For example, a circuitry may include one or more transistors interconnected to form logic gates that collectively implement a logical function.

FIG. 1 is a block diagram of an example of an apparatus 100 for energy harvesting. FIG. 1 shows a basic design where two comparators 120 and 130, through inverters and buffers drive active diode gates in a full-wave charge pump 110. Capacitors are external, and this example apparatus 100 is driven by an electromagnetic harvester which is basically a coil that goes through a magnet. A bias circuit 140 (e.g., as described in E. Dallago, D. Miatton, G. Venchi, V. Bottarel, G. Frattini, G. Ricotti, and M. Schipani, "Active self-supplied AC-DC converter for piezoelectric energy scavenging systems with supply independent bias," in IEEE International Symposium on Circuits and Systems, 2008. ISCAS 2008., 2008, pp. 1448-1451.) has two outputs, Vbias_P and Vbias_N. In the apparatus 100 of FIG. 1 only Vbias_P is used. Vbias_P starts at ground and stays at ground until the output of a Cockcroft Walton charge pump VStore is one Vth (~400 mV-450 mV) above ground. At this point Vbias_P rises with VStore, but remains one Vth below VStore. Vbias_N acts differently. Initially Vbias_N rises with VStore until reaches about one Vth where it remains. These unique characteristics of Vbias_N can be used to control the functioning of a DC-DC Dickson charge pump during start-up. Improvements to the apparatus 100 described herein may build from this initial low voltage start-up.

Figure 2A:
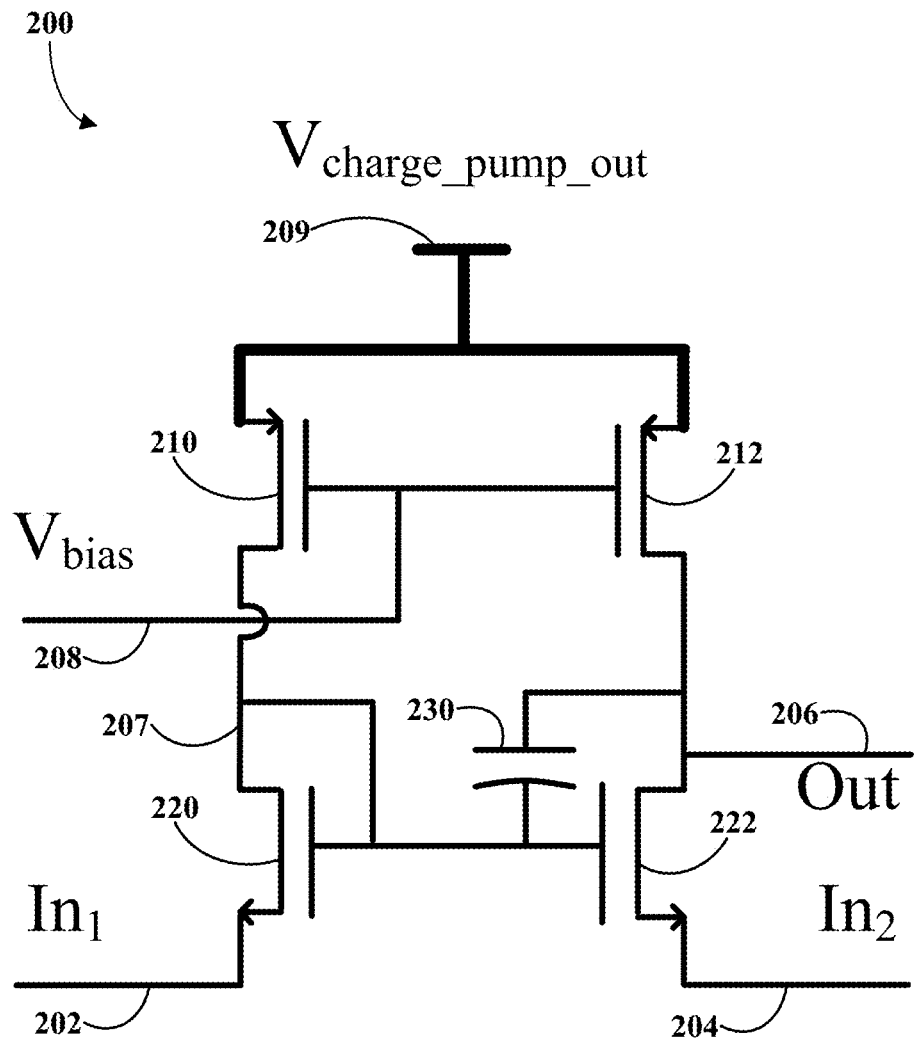
FIG. 2A is a circuit diagram of an example of a comparator circuitry.
Figure 2B:
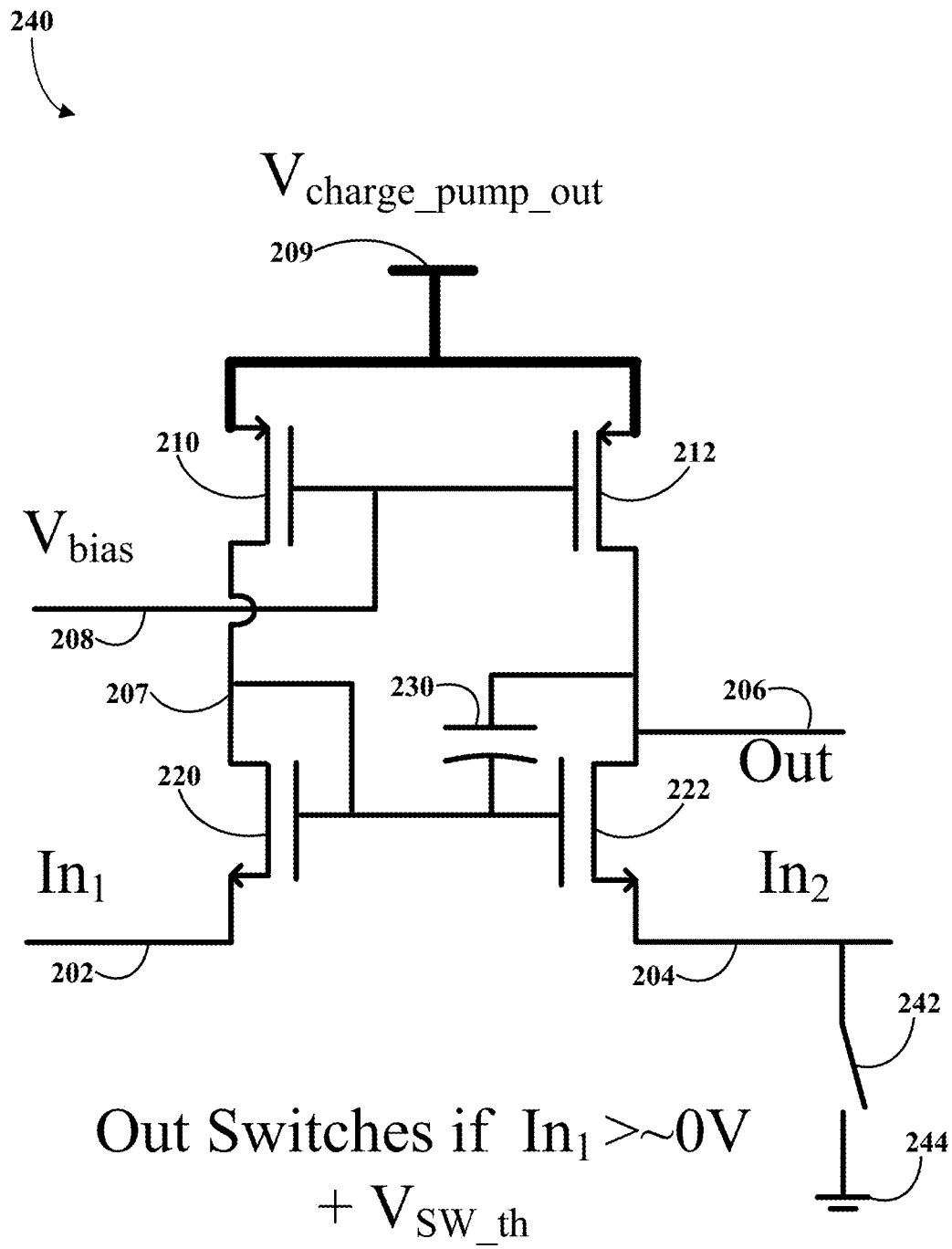
FIG. 2B is a circuit diagram of an example of a comparator circuitry with a switch configured to selectively hold down a voltage at an input node of the comparator when an output of an AC-DC charge pump is above a threshold voltage.
Figure 2C:
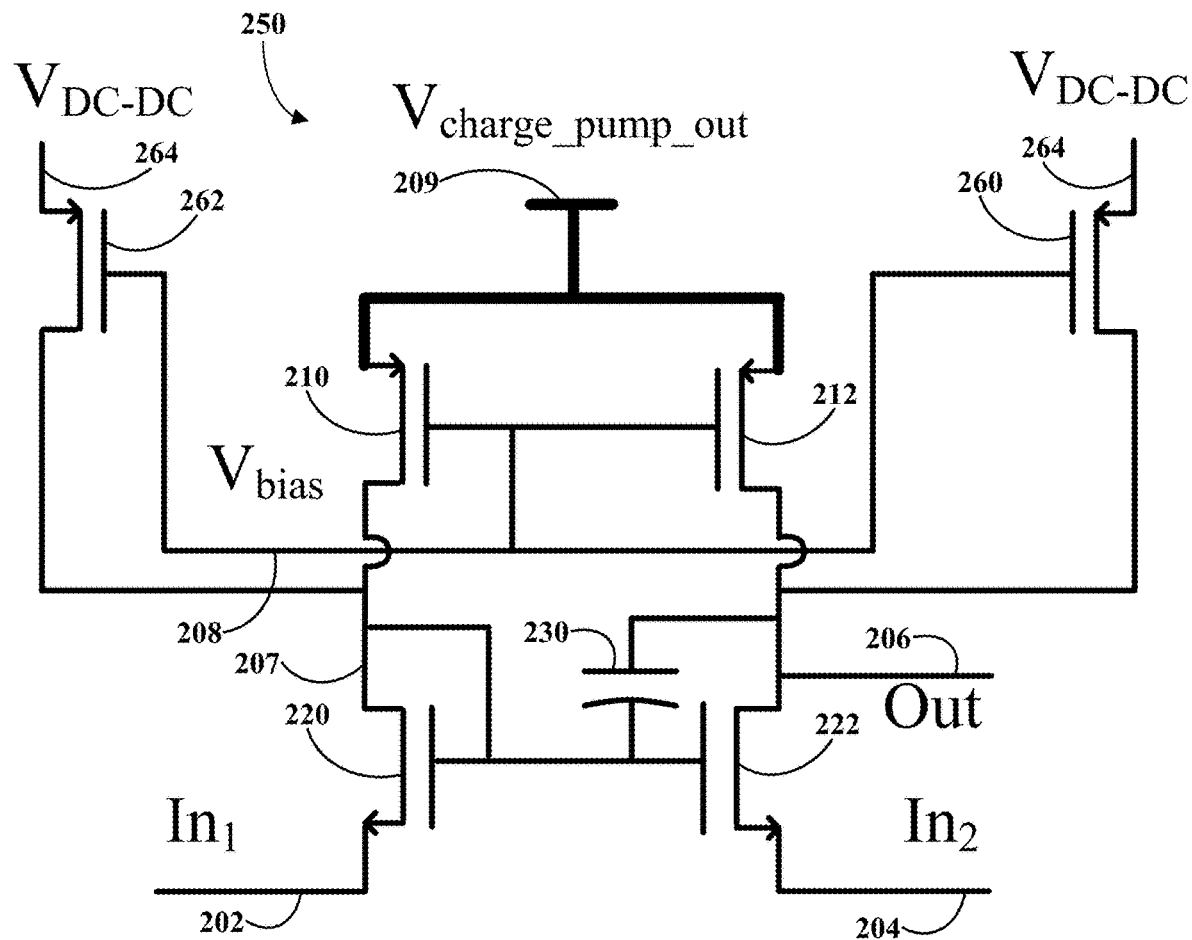
FIG. 2C is a circuit diagram of an example of a comparator circuitry with two PMOS transistors that connect an output of a DC-DC charge pump to nodes of the comparator.

The apparatus 100 uses a comparators 120 and 130 with a topologies matching the comparator circuitry 200 of FIG. 2A. Systems described herein may improve the performance (e.g., reducing start-up time) of the apparatus 100 by modifying the topology of the comparator 120 and/or the comparator 130 using one or more features of the comparator circuitry 240 of FIG. 2B and/or of the comparator circuitry 250 of FIG. 2C. An initial comparator design is shown in FIG. 2A. FIG. 2B shows a modification for selectively holding down a comparator input 112. FIG. 2C shows a modification for adding a higher voltage to the comparator.

FIG. 2A is a circuit diagram of an example of a comparator circuitry 200. The comparator circuitry 200 includes a first input node 202, a second input node 204, an output node 206, a first node 207, and a bias voltage node 208. The comparator circuitry 200 draws power from an output 209 of an AC-DC charge pump (e.g., the AC-DC charge pump 110). The comparator circuitry 200 includes a first PMOS transistor 210 with a gate terminal connected to the bias voltage node 208, a source terminal connected to the output 209 of the AC-DC charge pump, and a drain terminal connected to the first node 207; a second PMOS transistor 212 with a gate terminal connected to the bias voltage node 208, a source terminal connected to the output 209 of the AC-DC charge pump, and a drain terminal connected to the output node 206; a first NMOS transistor 220 with a gate terminal connected to the first node 207, a source terminal connected to a first input node 202, and a drain terminal connected to the first node 207; and a second NMOS transistor 222 with a gate terminal coupled to the first node 207, a source terminal connected to a second input node 204, and a drain terminal connected to the output node 206. The gate terminal of the second NMOS transistor 222 is also coupled to the output node 206. In this example, the gate terminal of the second NMOS transistor 222 is coupled to the output node 206 via a capacitor 230 connected between the gate terminal of the second NMOS transistor 220 and the output node 206.

FIG. 2B is a circuit diagram of an example of a comparator circuitry 240 with a switch 242 configured to selectively hold down a voltage at an input node 204 of the comparator 240 when an output of an AC-DC charge pump is above a threshold voltage. The comparator circuitry 240 includes the components of the comparator circuitry 200 and is modified to include a switch 242 connected between the second input node 204 and a ground node 244. For example, the switch 242 may be an NMOS transistor with a gate terminal connected to an output node of a DC-DC charge pump (e.g., the DC-DC charge pump 340), a source terminal connected to the ground node 244, and a drain terminal connected to the second input node 204. In some implementations, the DC-DC charge pump takes the output of the AC-DC charge pump as input.

Figure 3:
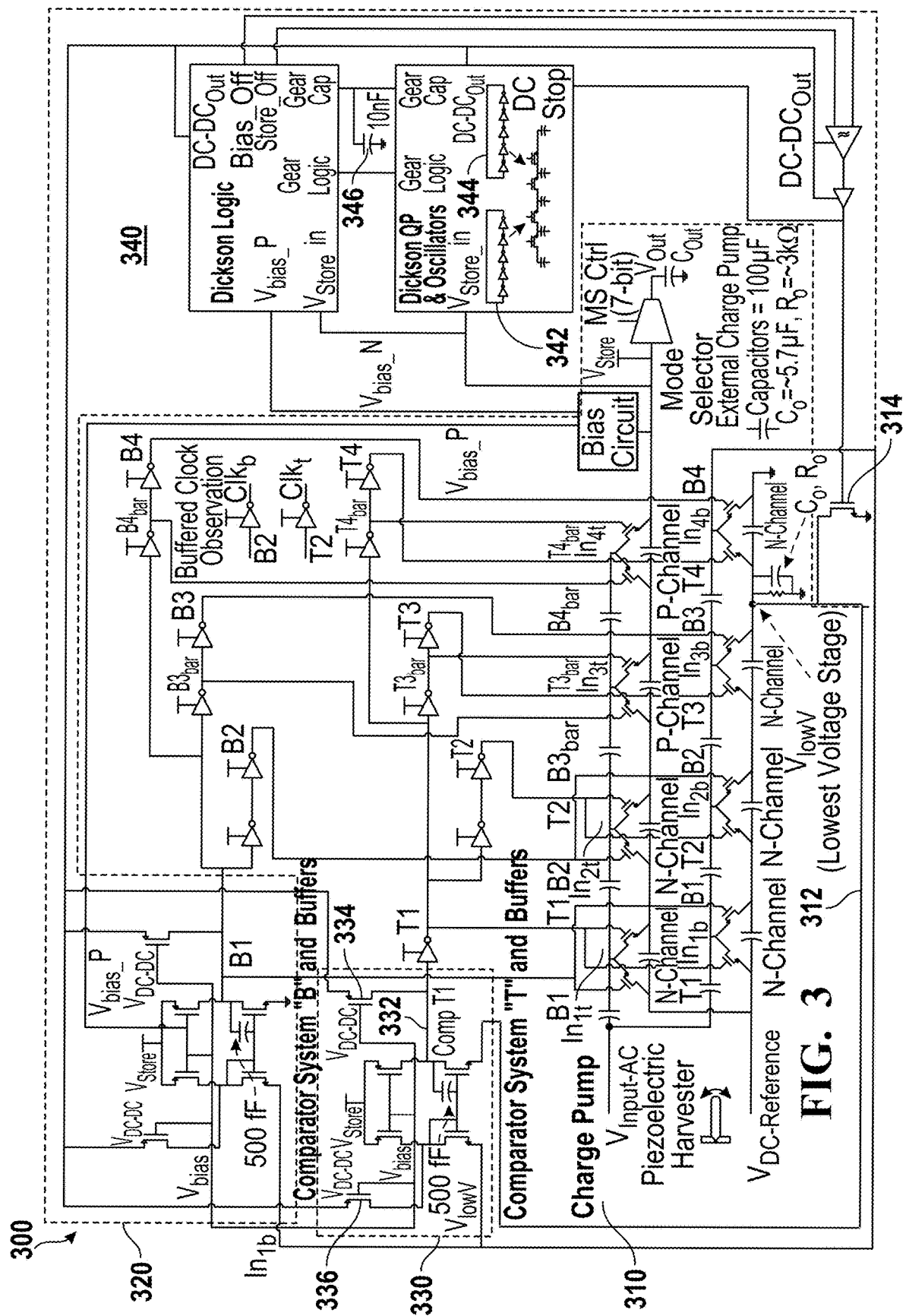
FIG. 3 is a circuit diagram of an example of an apparatus for energy harvesting.

The switch 242 may be added to a comparator in an apparatus for energy harvesting (e.g., as shown in FIG. 3) to improve the performance of a charge pump system. For example, a charge pump may include a comparator 240 with an input node 204 connected to a lowest voltage stage of a charge pump; and a switch 242 connected between the input node 204 and a ground node 244. For example, the charge pump may be an AC-DC charge pump, and the switch 242 may be an NMOS transistor (e.g., the NMOS transistor 314) with a gate terminal connected to an output node of a DC-DC charge pump, a source terminal connected to the ground node 244, and a drain terminal connected to the input node 204. In some implementations, the DC-DC charge pump (e.g., the DC-DC charge pump 340) takes an output of the AC-DC charge pump (e.g., the AC-DC charge pump 310) as input.

FIG. 2C is a circuit diagram of an example of a comparator circuitry 250 with two PMOS transistors 260 and 262 that connect an output of a DC-DC charge pump to nodes of the comparator. The comparator circuitry 250 includes the components of the comparator circuitry 200 and is modified to include a third PMOS transistor 260 with a gate terminal connected to the bias voltage node 208, a source terminal connected to an output 264 of a DC-DC charge pump, and a drain terminal connected to the output node 206. In some implementations, the DC-DC charge pump takes the output of the AC-DC charge pump as input. The comparator circuitry 250 includes a fourth PMOS transistor 262 with a gate terminal connected to the bias voltage node 208, a source terminal connected to the output 264 of the DC-DC charge pump, and a drain terminal connected to the first node 207.

In some implementations, the DC-DC charge pump includes a first oscillator supplied directly by the output of the AC-DC charge pump; a second oscillator supplied by a voltage across a capacitor; and an oscillator selection logic circuitry configured to select, based on a voltage level of the output of the AC-DC charge pump, between a signal from the first oscillator and a signal from the second oscillator to clock components of the DC-DC charge pump. For example, the DC-DC charge pump may be the DC-DC charge pump 400 of FIG. 4.

Some implementations of a modified comparator circuitry (not shown in FIG. 2C), may omit third PMOS transistor 260 or the fourth PMOS transistor 262 from the comparator circuitry 250. For example, a comparator circuitry may be modified to include a first PMOS transistor 210 with a gate terminal connected to a bias voltage node 208, a source terminal connected to an output 209 of an AC-DC charge pump, and a drain terminal connected to a first node 207; a second PMOS transistor 212 with a gate terminal connected to the bias voltage node 208, a source terminal connected to the output 209 of the AC-DC charge pump, and a drain terminal connected to an output node 206; a first NMOS transistor 220 with a gate terminal connected to the first node 207, a source terminal connected to the first input node 202, and a drain terminal connected to the first node 207; a second NMOS transistor 222 with a gate terminal coupled to the output node 206, a source terminal connected to a second input node 204, and a drain terminal connected to the first node 207; and a third PMOS transistor 262 with a gate terminal connected to the bias voltage node 208, a source terminal connected to an output 264 of a DC-DC charge pump, and a drain terminal connected to the first node 207. In some implementations, the DC-DC charge pump takes the output 209 of the AC-DC charge pump as input.

FIG. 3 is a circuit diagram of an example of an apparatus 300 for energy harvesting with modifications from the apparatus of FIG. 1. For example, the apparatus 300 may be implemented as an integrated circuit. The apparatus 300 includes a charge pump including a comparator 330 with an input node 312 connected to a lowest voltage stage of the charge pump 310; and a switch 314 connected between the input node 312 and a ground node. In the example of FIG. 3, the charge pump 310 is an AC-DC charge pump, and the switch 314 is an NMOS transistor with a gate terminal connected to an output node of a DC-DC charge pump 340, a source terminal connected to the ground node, and a drain terminal connected to the input node 312. The DC-DC charge pump 340 takes an output of the AC-DC charge pump 310 as input.

Added components to the apparatus 300, which are new with respect to the apparatus 100, are shown in grey in FIG. 3. Added components include a DC-DC charge pump 340 and its logic control as well as other modifications to improve start-up. In the grey area in the center to top right of FIG. 3 shows the formation VDC-DC output voltage from a Dickson charge pump 340 with the DC input connected to the output of an AC-DC active diode Cockcroft Walton charge pump 310. While the Dickson charge pump-based DC-DC converter 340 includes two parts seen in FIG. 4. The core Dickson architecture described in the block labeled "Dickson QP and Oscillators" uses one of two oscillators that starts-up and begin to clock the Dickson charge pump. One oscillator 342 is used and supplied directly from output of the Cockcroft Walton charge pump 310 while the other oscillator 344 is supplied from a capacitor 346 at a lower voltage. This can conceptually be thought of as a "Geared Capacitor" as it powers an oscillator 344 that switches at a significantly lower frequency (like a lower gear). The block labeled "Dickson Logic" controls when during start-up the Dickson charge pump switches to the oscillator controlled by a lower geared voltage, the charging of a storage capacitor to supply the lower "geared voltage", and finally the control to enable and disable the Dickson Charge Pump from holding down an input 312 to a comparator.

The comparator architecture described in FIG. 2C with a VDC-DC power supply input replaces the previous comparators in the top left corner of FIG. 3. The comparator's VBias voltage generated Bias Circuit 140 is also used to bias the gates of the P-Channel devices taking the supply of the VDC-DC power supply input. At the bottom of FIG. 3, the VDC-DC input is used to temporarily hold down one of the inputs 312 into a comparator from on the lowest voltage stage of the Cockcroft Walton charge pump 310. This is the modification described in FIG. 2B. The comparator on the bottom right corner of FIG. 3 has the inputs Vbias_N and VStore (the output of the Cockcroft Walton Charge Pump 310). As described later, these outputs may cross and switch this comparator near when the VStore reaches 0.45V-0.5V. This holds down the input 312 into the comparator switching the Cockcroft Walton charge pump 310 long enough for it to start-up.

The apparatus 300 includes a first comparator circuitry 320 (e.g., the comparator circuitry 250 of FIG. 2C) and a second comparator circuitry 330 (e.g., a comparator circuitry combining features of the comparator circuitry 240 of FIG. 2B with features of the comparator circuitry 250 of FIG. 2C). For example, the second comparator circuitry 330 includes a first PMOS transistor with a gate terminal connected to a bias voltage node, a source terminal connected to an output of an AC-DC charge pump, and a drain terminal connected to a first node; a second PMOS transistor with a gate terminal connected to the bias voltage node, a source terminal connected to the output of the AC-DC charge pump, and a drain terminal connected to an output node 332; a first NMOS transistor with a gate terminal connected to the first node, a source terminal connected to a first input node, and a drain terminal connected to the first node; a second NMOS transistor with a gate terminal coupled to the output node 332, a source terminal connected to a second input node 312, and a drain terminal connected to the output node 332; and a switch 314 connected between the second input node 312 and a ground node. In some implementations, the switch 314 is an NMOS transistor with a gate terminal connected to an output node of a DC-DC charge pump 340, a source terminal connected to the ground node, and a drain terminal connected to the second input node 312. The DC-DC charge pump 340 takes the output of the AC-DC charge pump 310 as input. In this example, the second input node 312 is connected to a lowest voltage stage of the AC-DC charge pump 310. In some implementations, the switch 314 may be configured to enter a conducting state to hold down a voltage at the second input node 312 when the output of the AC-DC charge pump 310 is above a threshold. The second comparator circuitry 330 includes a capacitor connected between the gate terminal of the second NMOS transistor and the output node 332. The apparatus 300 includes a PMOS transistor 336 with a gate terminal connected to the bias voltage node, a source terminal connected to an output of the DC-DC charge pump 340, and a drain terminal connected to the first node. The DC-DC charge pump 340 takes the output of the AC-DC charge pump 310 as input. The apparatus 300 includes a PMOS transistor 334 with a gate terminal connected to the bias voltage node, a source terminal connected to an output of a DC-DC charge pump 340, and a drain terminal connected to the output node 332.

The apparatus 300 includes a third PMOS transistor 336 with a gate terminal connected to the bias voltage node, a source terminal connected to an output of a DC-DC charge pump 340, and a drain terminal connected to the first node; and a fourth PMOS transistor 334 with a gate terminal connected to the bias voltage node, a source terminal connected to the output of the DC-DC charge pump, and a drain terminal connected to the output node 332.

The apparatus 300 includes a DC-DC charge pump 340 with an output that controls the switch 314. The DC-DC charge pump 340 includes a first oscillator 342 supplied directly by the output of the AC-DC charge pump 310; a second oscillator 344 supplied by a voltage across a capacitor 346; and an oscillator selection logic circuitry configured to select, based on a voltage level of the output of the AC-DC charge pump 310, between a signal from the first oscillator 342 and a signal from the second oscillator 344 to clock components of the DC-DC charge pump 340. For example, the DC-DC charge pump 340 may be the DC-DC charge pump 400 of FIG. 4. In some implementations, the oscillator selection logic circuitry is configured such that, when the second oscillator is selected, the voltage across the capacitor 346 is lower than a voltage of the output of the AC-DC charge pump 310. For example, the capacitor 346 may be charged from the output of the AC-DC charge pump 310. For example, the DC-DC charge pump 340 may be a Dickson charge pump. For example, the DC-DC charge pump may be a Cockcroft Walton charge pump. For example, the AC-DC charge pump 310 may be a Cockcroft Walton charge pump.

The apparatus includes an AC-DC charge pump that includes a comparator 330 including a first current source that draws current from an output of the AC-DC charge pump 310 and a second current source that draws current from an output of a DC-DC charge pump 340. The DC-DC charge pump 340 takes the output of the AC-DC charge pump 310 as input. In this example, the second current source includes a PMOS transistor 334 with a gate terminal connected to a bias voltage node, a source terminal connected to the output of the DC-DC charge pump 340, and a drain terminal connected to an output node 332 of the comparator. In some implementations, an input node of the AC-DC charge pump may be coupled to a piezo electric energy harvester in a sensor-based orthotic configured detect signals indicative of ulcer formation occurring in a shoe.

Figure 4:
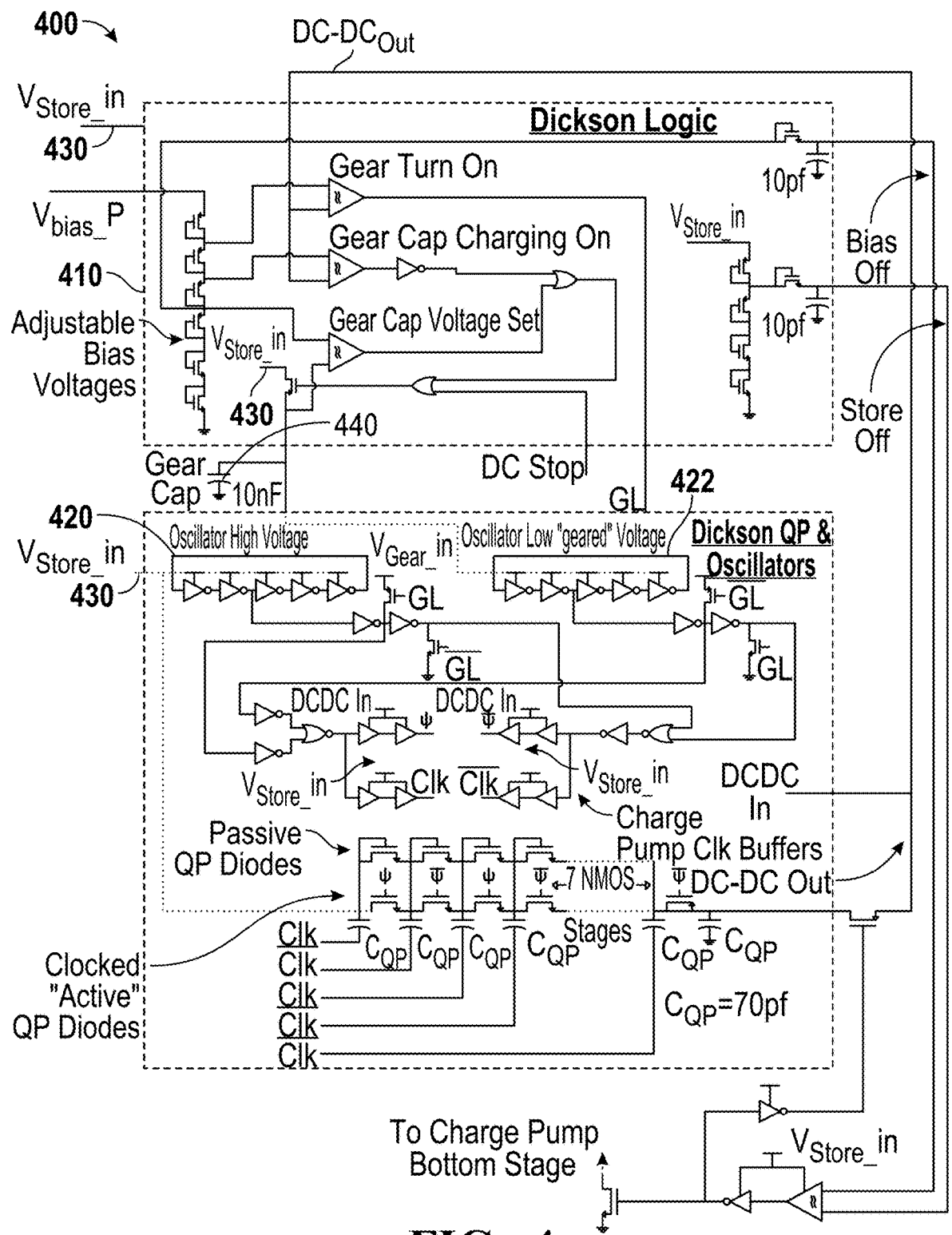
FIG. 4 is a circuit diagram of an example of a DC-DC charge pump with control circuitry.

FIG. 4 is a circuit diagram of an example of a DC-DC charge pump 400 with control circuitry. FIG. 4 shows the details of the DC-DC charge pump 400, oscillators 420 and 422, and logic control 410. For example, the DC-DC charge pump 400 may be implemented as part of an integrated circuit. The DC-DC charge pump 400 may be connected to output 430 an AC-DC charge pump (e.g., the AC-DC charge pump 310). The DC-DC charge pump 400 includes a first oscillator 420 supplied directly by an output 430 of the AC-DC charge pump; a second oscillator 422 supplied by a voltage across a capacitor 440; and an oscillator selection logic circuitry 410 configured to select, based on a voltage level of the output of the AC-DC charge pump, between a signal from the first oscillator 420 and a signal from the second oscillator 422 to clock components of the DC-DC charge pump 400. In some implementations, the oscillator selection logic circuitry 410 is configured such that, when the second oscillator 422 is selected, the voltage across the capacitor 440 is lower than a voltage of the output 430 of the AC-DC charge pump. In this example, the capacitor 440 is charged from the output 430 of the AC-DC charge pump. For example, the capacitor 440 may be part of an integrated circuit. For example, the AC-DC charge pump may be a Cockcroft Walton charge pump. For example, the DC-DC charge pump 400 may be a Dickson charge pump. For example, the DC-DC charge pump 400 may be a Cockcroft Walton charge pump.

A detailed view of the logic circuit and the DC-DC Dickson charge pump is seen in FIG. 4. The Dickson Charge Pump, Dickson Oscillators, and corresponding Dickson Logic are seen in FIG. 4. At the bottom of FIG. 4 the basic Dickson charge pump is shown. At the bottom of FIG. 4 eleven NMOS stages and one PMOS stage are used (seven of the NMOS stages are not shown in FIG. 4). In looking at the eleven NMOS diodes, a passive NMOS connected diode is in parallel with clocked active diode. This architecture (see, e.g., Chen Po-Hung, K. Ishida, Zhang Xin, Y. Okuma, Y. Ryu, M. Takamiya, and T. Sakurai, "A 120-mV input, fully integrated dual-mode charge pump in 65-nm CMOS for thermoelectric energy harvester," in 2012 17th Asia and South Pacific Design Automation Conference (ASP-DAC), 2012, pp. 469-470) allows for the MOSFET diodes of the charge pump to be clocked at both their Sources/Drains and gates. In this way the sources/drains are clocked at about the same time as the gates are clocked at the higher DC-DC voltage. The output of the AC-DC Cockcroft Walton charge pump may be originally used to set frequency of the clock used for the Dickson Charge Pump. This works well for the original start-up, but troubles arise as VStore rises past ~225 mV. The clocks frequency may go too high and may drain too much power. For example, at a VStore of ~205 mV, the corresponding oscillator frequency is ~1 kHz, while at a VStore of 150 mV the oscillator frequency is ~71 Hz. If the oscillator frequency starts to significantly exceed 1 kHz, too much power may be drained from the VStore and it could actually stall VStore's rise. Most of current draw occurs in the buffers driving the capacitors of the charge pump. To effectively drive the Dickson charge pump through the capacitors (designed to be 60 pf), the devices in the buffers were large. For example, in the final buffer PMOS device of width 10 μW and 50 fingers with a minimum length (180 nm) while the NMOS may have 10 μW and 10 fingers at minimum length.

Figure 5:
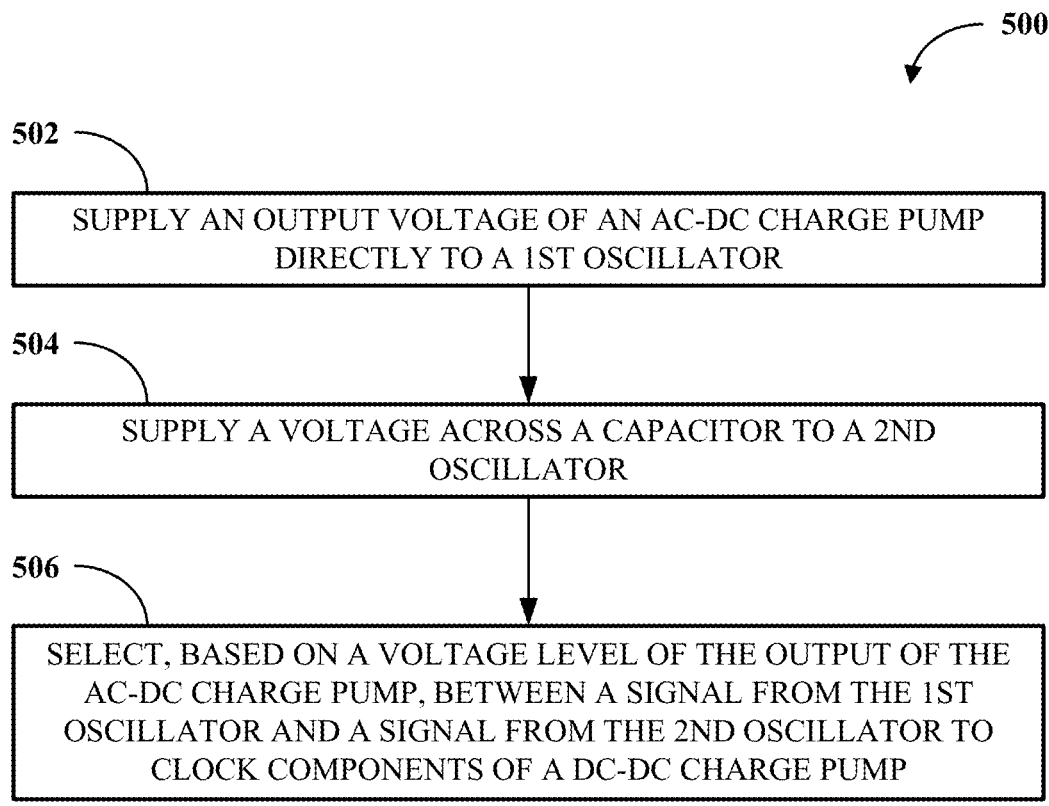
FIG. 5 is a flow chart of an example of a process for control of a DC-DC charge pump for energy harvesting.

FIG. 5 is a flow chart of an example of a process 500 for control of a DC-DC charge pump for energy harvesting. The process 500 includes supplying 502 an output of an AC-DC charge pump (e.g., the AC-DC charge pump 310) directly to a first oscillator (e.g., the first oscillator 420); supplying 504 a voltage across a capacitor (e.g., the capacitor 346) to a second oscillator (e.g., the second oscillator 422); and selecting 506, based on a voltage level of the output of the AC-DC charge pump, between a signal from the first oscillator and a signal from the second oscillator to clock components of a DC-DC charge pump (e.g., the DC-DC charge pump 340). In some implementations, when the second oscillator is selected, the voltage across the capacitor is lower than a voltage of the output of the AC-DC charge pump. For example, the capacitor may be charged from the output of the AC-DC charge pump. For example, the AC-DC charge pump may be a Cockcroft Walton charge pump. For example, the DC-DC charge pump may be a Dickson charge pump. For example, the DC-DC charge pump may be a Cockcroft Walton charge pump. For example, the process 500 may be implemented using the apparatus 300 of FIG. 3. For example, the process 500 may be implemented using the DC-DC charge pump 400 of FIG. 4.

Figure 6:
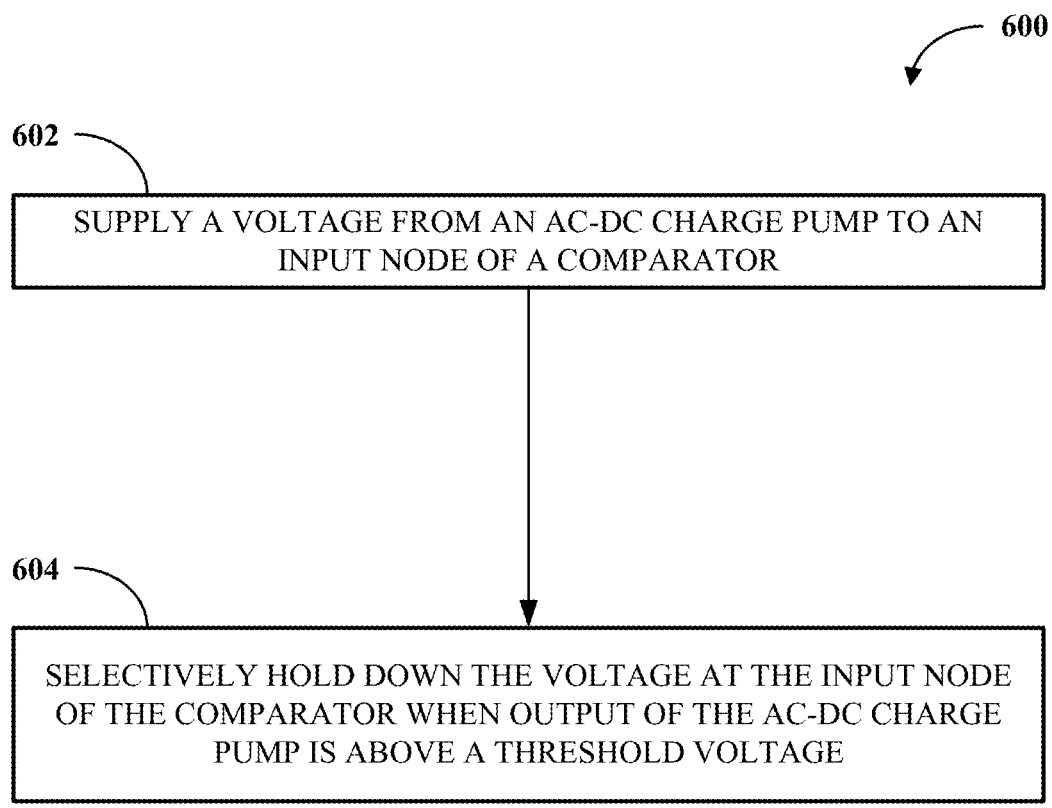
FIG. 6 is a flow chart of an example of a process for control of an AC-DC charge pump for energy harvesting.

FIG. 6 is a flow chart of an example of a process 600 for control of an AC-DC charge pump for energy harvesting. The process 600 includes supplying 602 a voltage from an AC-DC charge pump (e.g., the AC-DC charge pump 310) to an input node of a comparator (e.g., the comparator 330); and selectively holding down 604 the voltage at the input node of the comparator when an output of the AC-DC charge pump is above a threshold voltage. For example, the input node of the comparator may be connected to a lowest voltage stage of the AC-DC charge pump. In some implementations, the AC-DC charge pump takes input voltage from a piezo electric harvester in an orthotic shoe. For example, the process 600 may be implemented using the apparatus 300 of FIG. 3. For example, the process 600 may be implemented using the comparator circuitry 240 of FIG. 2B.

The process 600 may be combined with the process 500 of FIG. 5. For example, the process 600 may be modified to include supplying 502 the output of the AC-DC charge pump directly to a first oscillator; supplying 504 a voltage across a capacitor to a second oscillator; and selecting 506, based on a voltage level of the output of the AC-DC charge pump, between a signal from the first oscillator and a signal from the second oscillator to clock components of a DC-DC charge pump. In some implementations, when the second oscillator is selected, the voltage across the capacitor is lower than a voltage of the output of the AC-DC charge pump. For example, the capacitor may be charged from the output of the AC-DC charge pump. For example, the DC-DC charge pump may be a Dickson charge pump. For example, the DC-DC charge pump may be a Cockcroft Walton charge pump. For example, the AC-DC charge pump may be a Cockcroft Walton charge pump.

Figure 7:
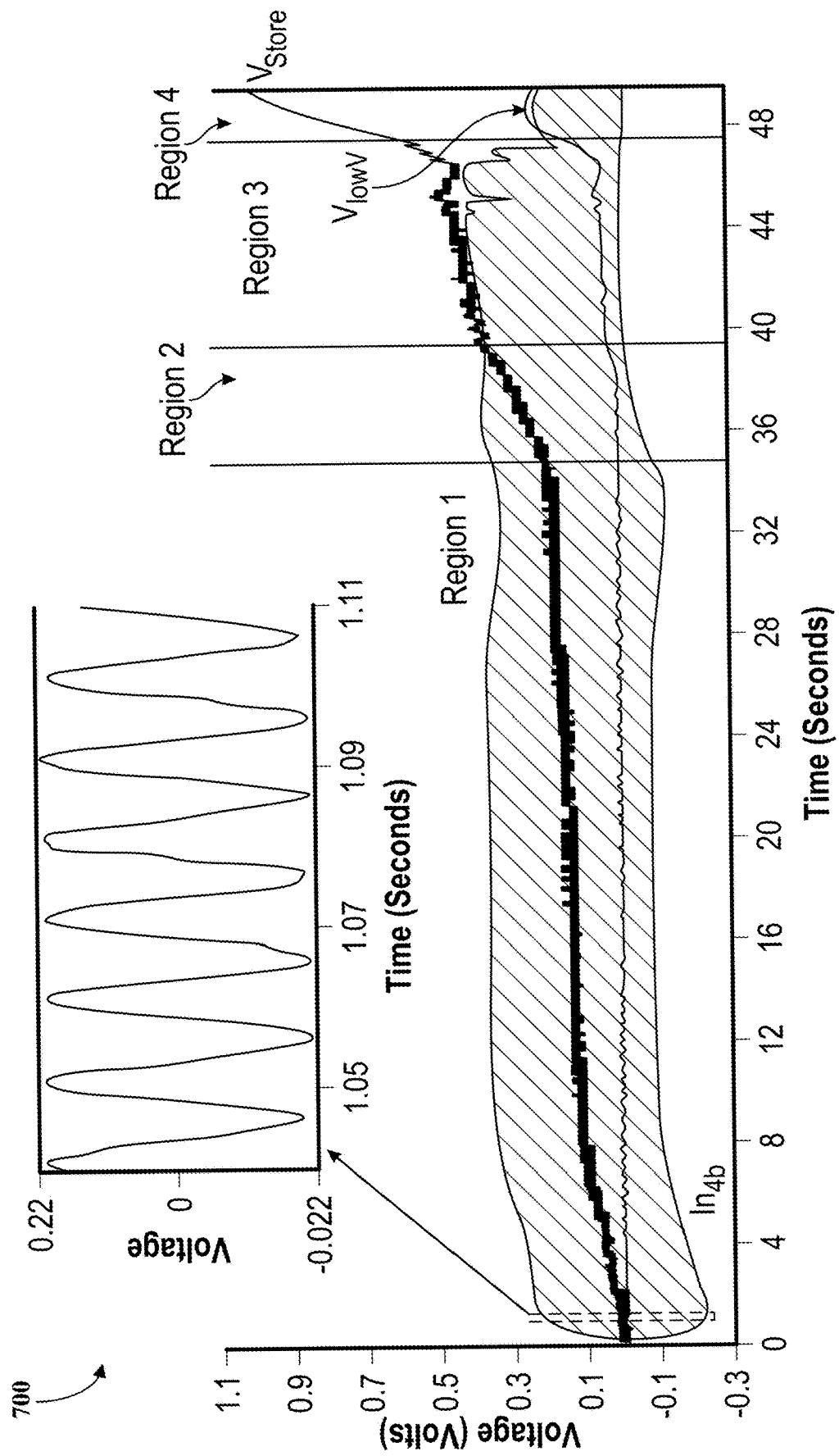
FIG. 7 is a plot of an example of an output voltage of an energy harvesting circuitry during start-up phases with a 220 millivolt AC input signal.

FIG. 7 is a plot of an example of an output voltage 700 of an energy harvesting circuitry during start-up phases with a 220 millivolt AC input signal. FIG. 7 shows start-up with an input of 220 mV divided into 4 regions. Region 1 and Region 3 show areas for start-up improvement where this new research focuses. In region 1, the start-up techniques previously developed work well until the input reaches about 100 mV, and then the voltage may stall for about a 30 seconds. Also, in region 3 the voltage rises and falls for nearly 10 seconds before rising into region 4. A core issue may with system's comparator that drives the system's inverters and buffers once it becomes active after the previous start-up techniques enable the input to reach about 100 mV. These comparators (located at the top level of FIG. 1) are not functioning well at low voltage. This is an important research challenge at low voltage. There are two reasons for this comparator difficulty corresponding to region 1 and 3. First, in region 1, as expected at a lower voltage there may be difficulty in switching the comparator. Second, as the input into the comparator in "System T" in FIG. 1 labeled lowest voltage stage (VlowV) rises the comparator, minimally functioning at low voltage already, has a more difficult time switching. To illustrate these problems better FIG. 2A shows the original comparator that switches when In1 is greater than In2 plus some additional switching threshold (i.e., VSW_th). At lower power supply voltages this switching threshold voltage (VSW_th) will be higher as it takes more voltage to switch the comparator at lower voltages. There are two potential fixes for this. First in FIG. 2B, the other input to the comparator in "System T" can rise above 0V and this means a higher voltage is needed to switch the comparator. In other words, switching threshold voltage (VSW_th) is higher as the DC input into the comparator rises above zero. To solve this, the input into the comparator can be held low to allow the comparator to continue to switch. Another fix is to use the output of the AC-DC charge pump to create a higher voltage using a DC-DC charge pump converter. This higher power supply can be fed into the additional supply inputs in the comparator as seen in FIG. 2C. In FIG. 2C the higher DC-DC voltage is included along with the voltage input from the output of the main AC-DC output. In some implementations, these fixes may be combined to improve start-up performance of an apparatus for energy harvesting. There may be extensive challenges to implement these fixes as can begin to be seen in FIG. 3 showing an example of a modified circuit.

Figure 8:
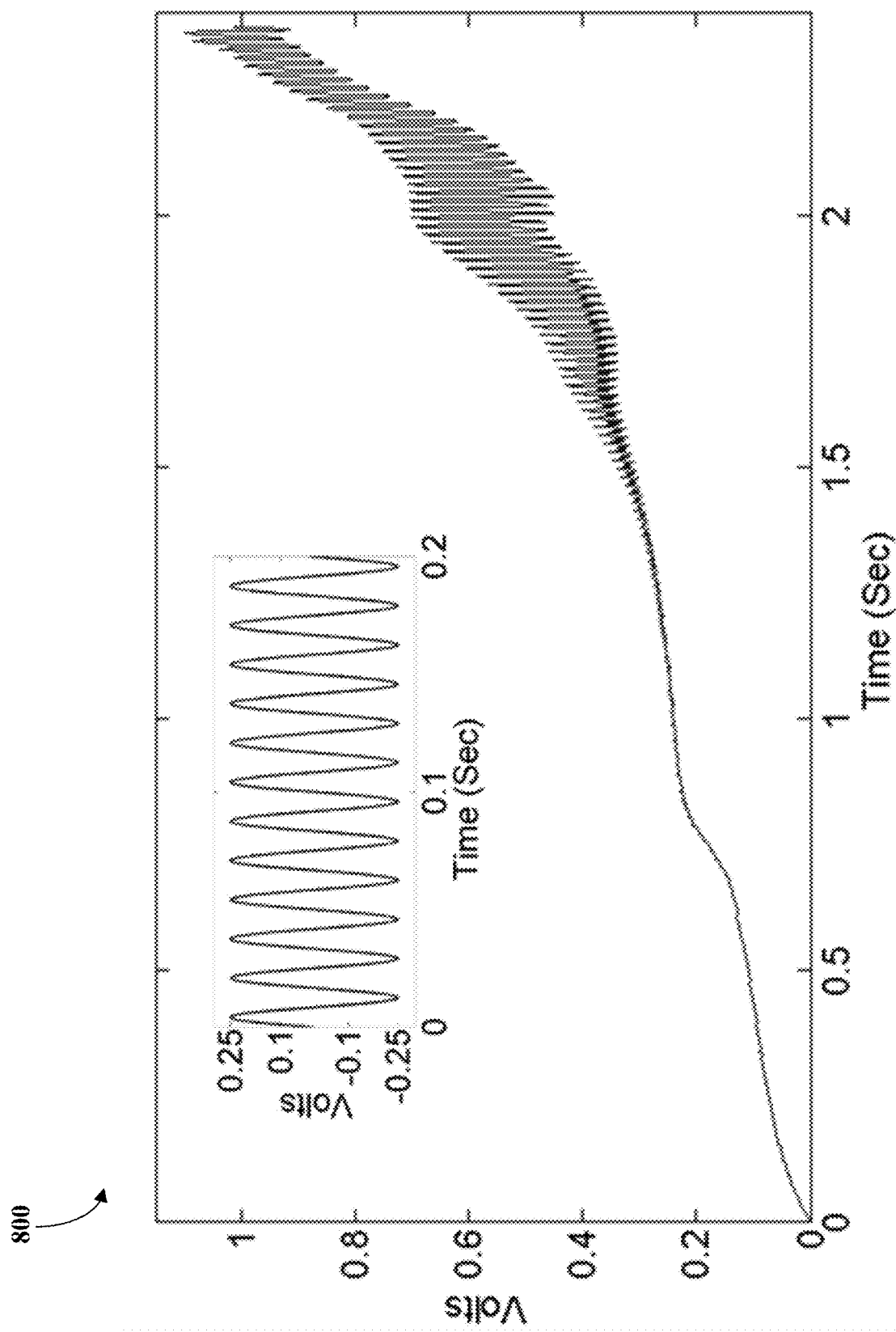
FIG. 8 is a plot of an example of an output voltage of an energy harvesting circuitry during start-up with a 220 millivolt AC input signal.

FIG. 8 is a plot of an example of an output voltage 800 of an energy harvesting circuitry during start-up with a 220 millivolt AC input signal. FIG. 8 depicts simulations results showing the input signal with a peak 0.25V, and the output VStore that rises to over 1V in about 2.5 seconds. Simulation results clearly show that in FIG. 8, the AC-DC charge pump takes an input with a 250 mV peak and the output of the charge pump VStore quickly rises to over 1V (i.e., in about 2.5 seconds).

Figure 9:
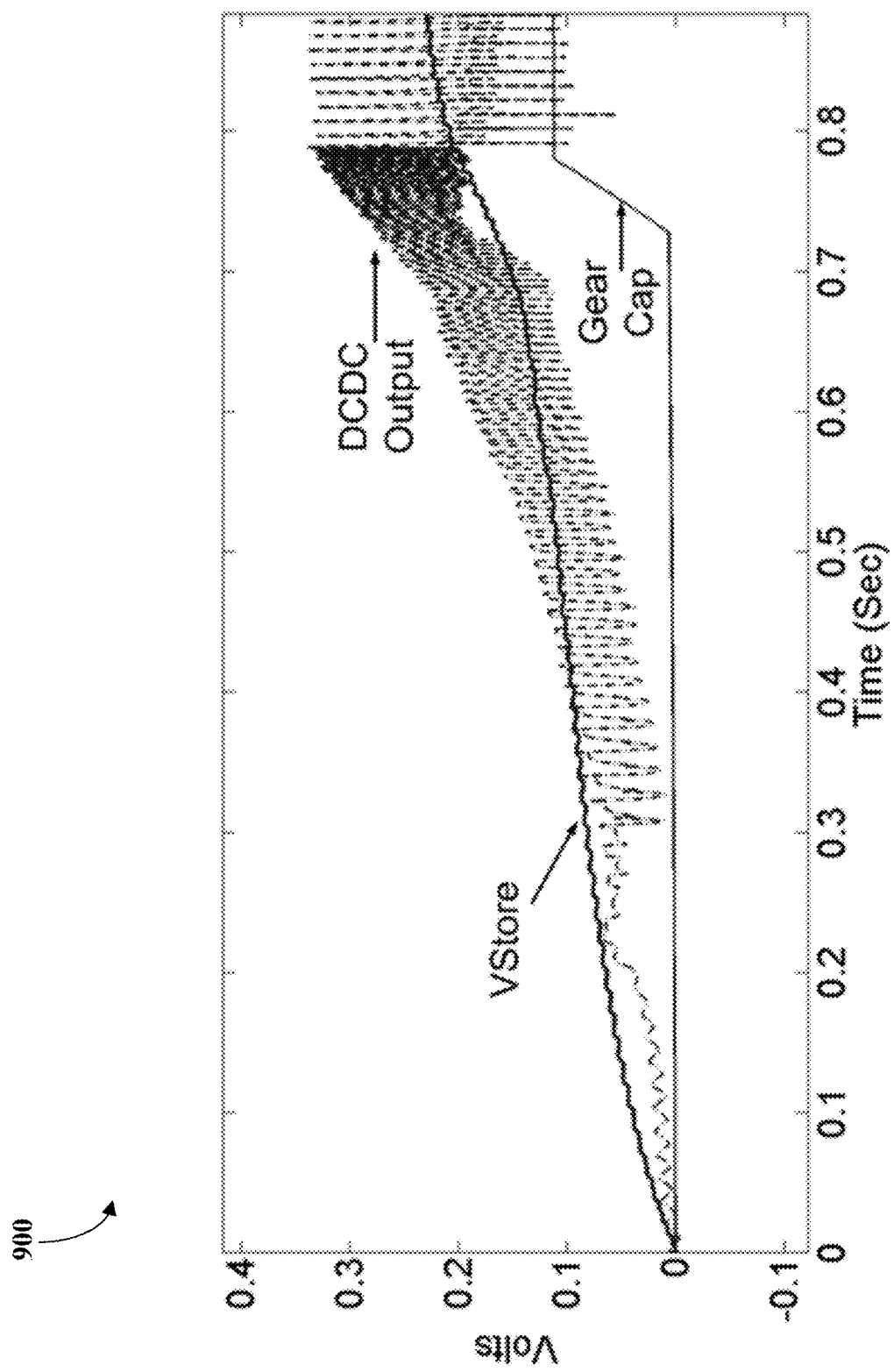
FIG. 9 is a plot of an example of an output voltage of an energy harvesting circuitry during start-up with a capacitor used to drive a DC-DC charge pump in a later phase.

FIG. 9 is a plot of an example of an output voltage 900 of an energy harvesting circuitry during start-up with a capacitor used to drive a DC-DC charge pump in a later phase. FIG. 9 depicts simulation results that show how the DC-DC charge pump rises above VStore and is able to aid in the circuit start-up (i.e., VStore rising). Originally, DC-DC converter is supplied by VStore, but at a certain level, an external cap charges, and the DC-DC output is supplied by this external capacitor (i.e., Gear Cap). FIG. 9 shows how the added DC-DC output that charges from the AC-DC used as an input into the DC-DC converter improves start-up. In FIG. 9, VStore initially rises, and once VStore, the output of the charge pump, reaches about 90 mV to 100 mV, and the DC-DC output voltage starts to rise above VStore. The output of the DC-DC charge pump may be fed into comparators 320 and 330 and additionally supply inputs as shown in the comparator circuitry 250 of FIG. 2C and in FIG. 3. As the DC-DC output rises above VStore, VStore rises at a greater rate showing that adding this DC-DC voltages does improve start-up. Also, included in FIG. 9 is the charging of the GearCap which acts a secondary voltage supply. A lower secondary voltage may be needed because of limitations with the technology (e.g., 180 nm CMOS). Basically, in 180 nm, an oscillator can only switch capacitors that are 60 pf in so quickly before there is a high power draw that could exceed the μW level produced by a vibration harvester. A ring oscillator may be used to create the signals for switching a DC-DC Dickson charge pump. As the voltage supplying the inverters in the ring oscillator rises, the frequency of the oscillators goes higher. By creating a lower voltage, the system can operate more slowly. The rising and set of the gear cap voltage as well as the decrease in the DC-DC voltage once the gear cap is enabled are also shown in FIG. 9.

Figure 10:
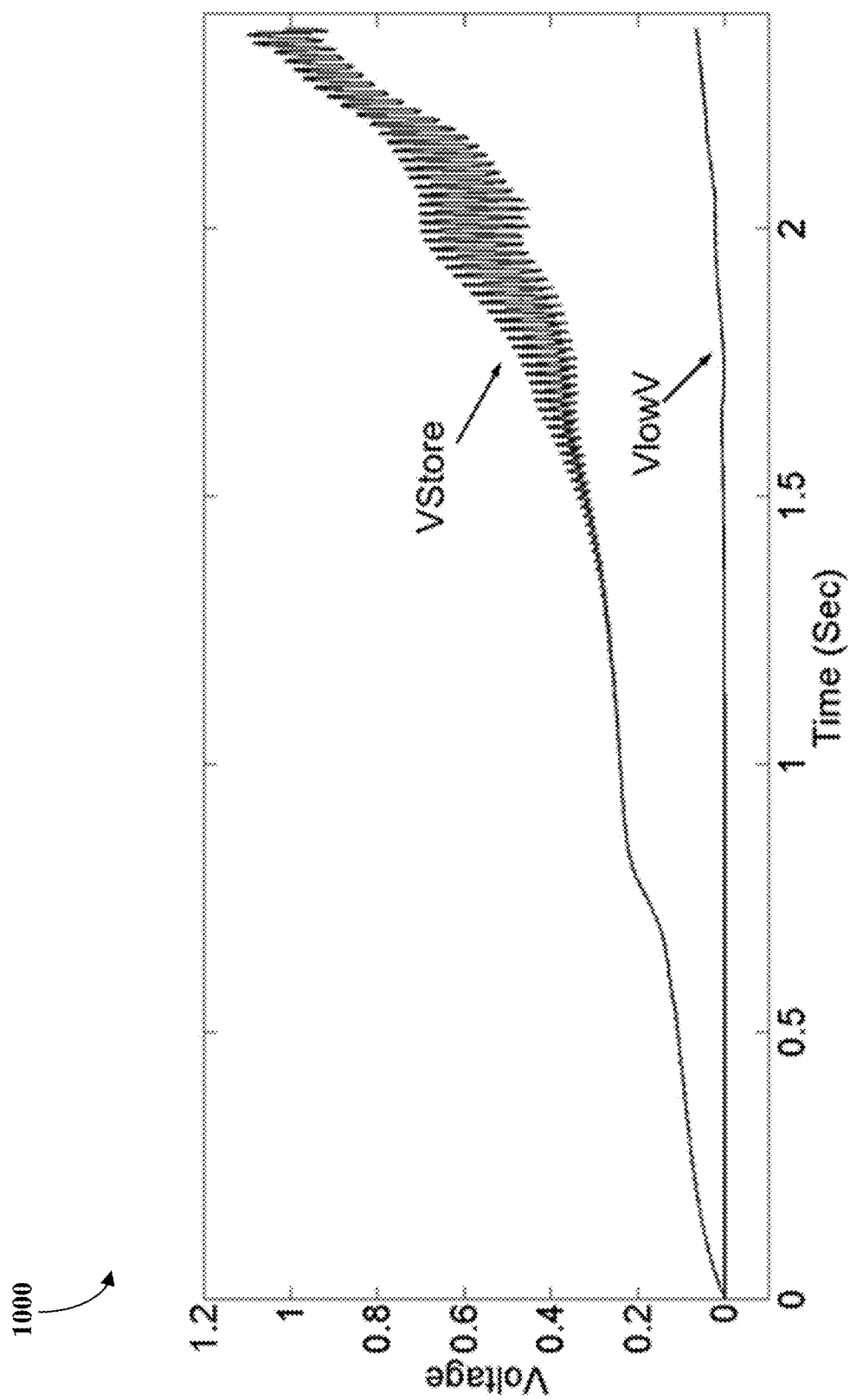
FIG. 10 is a plot of an example of an output voltage of an energy harvesting circuitry during start-up with a switch used to hold a comparator input voltage low until a later phase.

FIG. 10 is a plot of an example of an output voltage 1000 of an energy harvesting circuitry during start-up with a switch used to hold a comparator input voltage low until a later phase. To improve comparator switching, the input into a comparator (VlowV) may be held low until VStore has risen to about 0.4V. FIG. 10 shows the rise of VlowV (this is the lowest voltage stage that is connected to the input of the comparator is FIG. 2B and FIG. 3) and VStore. At VStore near 0.4V to 0.5V, VlowV is released and rises.

For example, apparatus described herein may be implemented in integrated circuits with 180 nm fabrication process technology. From an integrated circuit design perspective, this is an "old" technology that was first introduced in between 1998-2000. DC-DC converters used in energy harvesting built in 65 nm may produce better results. For example, for a thermal harvesting DC-DC converter built in 65 nm, the oscillator was able to achieve 1 MHz and higher starting with a voltage of 120 mV. A higher frequency oscillator at a newer technology may help improve overall results because much higher oscillator frequency will be achieved at a much lower current draw. This will in turn mean that more power can be sent to the Cockcroft Walton charge pump at a higher voltage from a DC-DC converter. This "could" improve turn-on voltage and allow the system to start up at lower voltage. Some implementations may achieve state-of-the-art results using a passive switching technique. The 180 nm Mosfet devices may have excellent characteristics that allow a leakage-based switching to allow initial start-up to begin with. Initial start-up characteristics in 180 nm may interact with a higher voltage DC-DC converter in newer technology, such as 65 nm, in ways that can produce a higher frequency oscillator and a better functioning Dickson charge pump based DCDC converter.

Near when VStore is at ~200 mV is enabled the "geared" oscillator turns on as it is powered by a storage capacitor "Gear Cap" at a lower voltage. The Dickson Logic at the top of FIG. 4 shows how the capacitor "Gear Cap" may be used to power the "geared" low voltage oscillator. In this example, the Dickson logic sets the voltage of the "Gear Cap", sets the time during start-up at which the "Gear Cap" starts charging, and finally turns on the use of the lower voltage "geared" oscillator. This is accomplished by comparing the DC-DC voltage output to drops across diodes tied to the Vbias_P from the bias circuit 140 in the top of FIG. 4.

Figure 11:
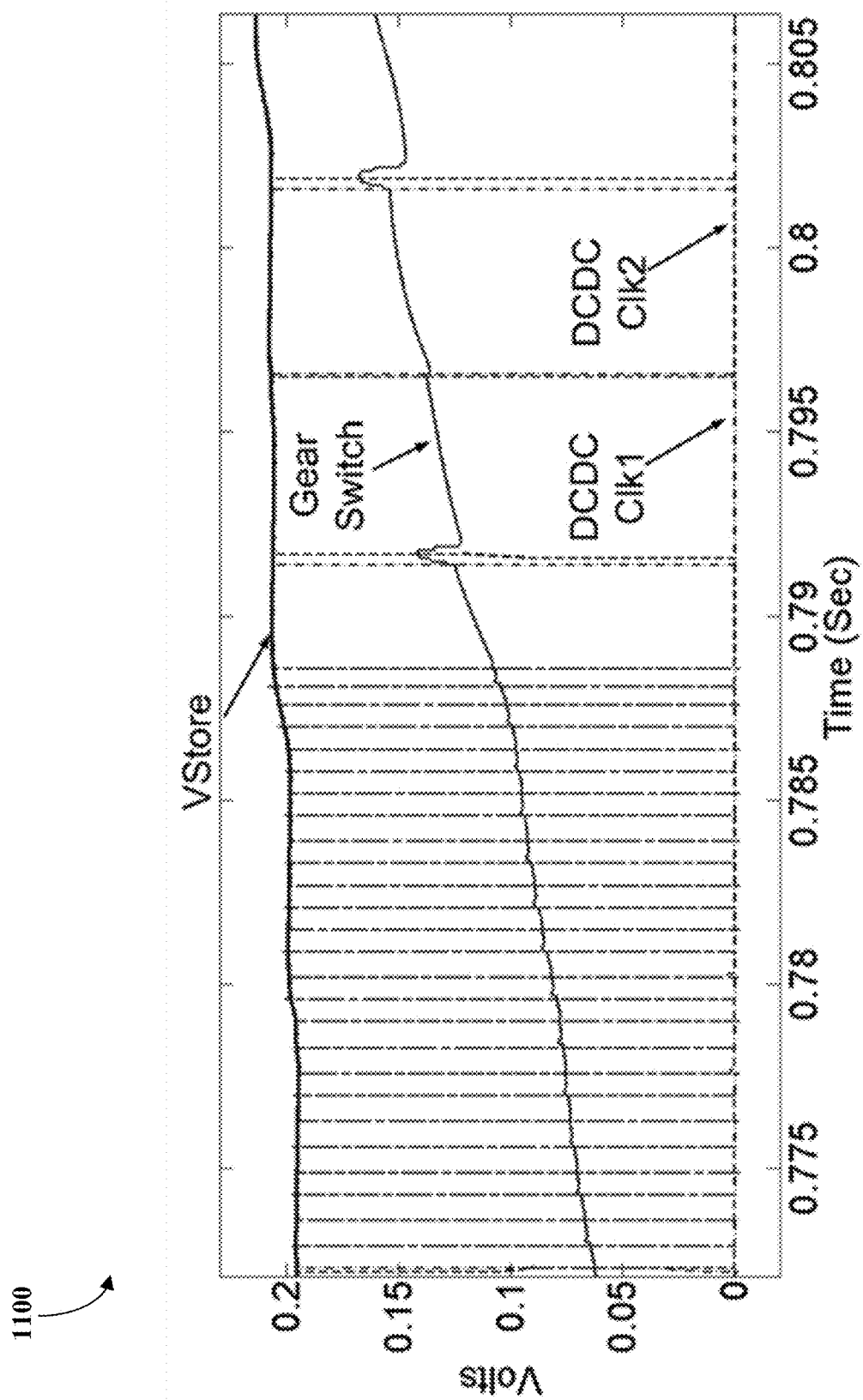
FIG. 11 is a plot of an example of an output voltage of an energy harvesting circuitry during start-up with clocking signals for DC-DC charge pump that are driven by a capacitor in a later phase.

FIG. 11 is a plot of an example of an output voltage 1100 of an energy harvesting circuitry during start-up with clocking signals for DC-DC charge pump that are driven by a capacitor in a later phase. FIG. 11 depicts simulation results showing that as the Gear Switch signal rises, the CLKing signals switching the DC-DC charge pump slow considerably, as designed. FIG. 11 shows the how the two clocks start oscillating at a low frequency once the Gear Switch signal goes high enough.

In a first aspect, the subject matter described in this specification can be embodied in an apparatus that includes a first PMOS transistor with a gate terminal connected to a bias voltage node, a source terminal connected to an output of an AC-DC charge pump, and a drain terminal connected to a first node; a second PMOS transistor with a gate terminal connected to the bias voltage node, a source terminal connected to the output of the AC-DC charge pump, and a drain terminal connected to an output node; a first NMOS transistor with a gate terminal connected to the first node, a source terminal connected to a first input node, and a drain terminal connected to the first node; a second NMOS transistor with a gate terminal connected to the first node, a source terminal connected to a second input node, and a drain terminal connected to the output node; and a switch connected between the second input node and a ground node.

In the first aspect, the apparatus may be an integrated circuit. In the first aspect, the switch may be an NMOS transistor with a gate terminal connected to an output node of a DC-DC charge pump, a source terminal connected to the ground node, and a drain terminal connected to the second input node. The DC-DC charge pump may take the output of the AC-DC charge pump as input. In the first aspect, the second input node may be connected to a lowest voltage stage of the AC-DC charge pump. In the first aspect, the switch may be configured to enter a conducting state to hold down a voltage at the second input node when the output of the AC-DC charge pump is above a threshold. In the first aspect, the apparatus may include a capacitor connected between the gate terminal of the second NMOS transistor and the output node. In the first aspect, the apparatus may include a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input. In the first aspect, the apparatus may include a third PMOS transistor with a gate terminal connected to the bias voltage node, a source terminal connected to an output of a DC-DC charge pump, and a drain terminal connected to the output node, wherein the DC-DC charge pump takes the output of the AC-DC charge pump as input. In the first aspect, the apparatus may include a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input; and a fourth PMOS transistor with a gate terminal connected to the bias voltage node, a source terminal connected to the output of the DC-DC charge pump, and a drain terminal connected to the output node. In the first aspect, the apparatus may include a DC-DC charge pump with an output that controls the switch, wherein the DC-DC charge pump includes: a first oscillator supplied directly by the output of the AC-DC charge pump; a second oscillator supplied by a voltage across a capacitor; and an oscillator selection logic circuitry configured to select, based on a voltage level of the output of the AC-DC charge pump, between a signal from the first oscillator and a signal from the second oscillator to clock components of the DC-DC charge pump. In the first aspect, the oscillator selection logic circuitry may be configured such that, when the second oscillator is selected, the voltage across the capacitor is lower than a voltage of the output of the AC-DC charge pump. In the first aspect, the capacitor may be charged from the output of the AC-DC charge pump. In the first aspect, the DC-DC charge pump may be a Dickson charge pump. In the first aspect, the DC-DC charge pump may be a Cockcroft Walton charge pump. In the first aspect, the AC-DC charge pump may be a Cockcroft Walton charge pump.

In a second aspect, the subject matter described in this specification can be embodied in an apparatus that includes a first PMOS transistor with a gate terminal connected to a bias voltage node, a source terminal connected to an output of an AC-DC charge pump, and a drain terminal connected to a first node; a second PMOS transistor with a gate terminal connected to the bias voltage node, a source terminal connected to the output of the AC-DC charge pump, and a drain terminal connected to an output node; a first NMOS transistor with a gate terminal connected to the first node, a source terminal connected to a first input node, and a drain terminal connected to the first node; a second NMOS transistor with a gate terminal coupled to the output node, a source terminal connected to a second input node, and a drain terminal connected to the output node; and a third PMOS transistor with a gate terminal connected to the bias voltage node, a source terminal connected to an output of a DC-DC charge pump, and a drain terminal connected to the output node, wherein the DC-DC charge pump takes the output of the AC-DC charge pump as input.

In the second aspect, the apparatus may be an integrated circuit. In the second aspect, the apparatus may include a fourth PMOS transistor with a gate terminal connected to the bias voltage node, a source terminal connected to the output of the DC-DC charge pump, and a drain terminal connected to the first node. In the second aspect, the DC-DC charge pump may include a first oscillator supplied directly by the output of the AC-DC charge pump; a second oscillator supplied by a voltage across a capacitor; and an oscillator selection logic circuitry configured to select, based on a voltage level of the output of the AC-DC charge pump, between a signal from the first oscillator and a signal from the second oscillator to clock components of the DC-DC charge pump. In the second aspect, the oscillator selection logic circuitry may be configured such that, when the second oscillator is selected, the voltage across the capacitor is lower than a voltage of the output of the AC-DC charge pump. In the second aspect, the capacitor may be charged from the output of the AC-DC charge pump. In the second aspect, the AC-DC charge pump may be a Cockcroft Walton charge pump. In the second aspect, the DC-DC charge pump may be a Dickson charge pump. In the second aspect, the DC-DC charge pump may be a Cockcroft Walton charge pump.

In a third aspect, the subject matter described in this specification can be embodied in an apparatus that includes a first PMOS transistor with a gate terminal connected to a bias voltage node, a source terminal connected to an output of an AC-DC charge pump, and a drain terminal connected to a first node; a second PMOS transistor with a gate terminal connected to the bias voltage node, a source terminal connected to the output of the AC-DC charge pump, and a drain terminal connected to an output node; a first NMOS transistor with a gate terminal connected to the first node, a source terminal connected to a first input node, and a drain terminal connected to the first node; a second NMOS transistor with a gate terminal coupled to the output node, a source terminal connected to a second input node, and a drain terminal connected to the output node; and a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input.

In the third aspect, the apparatus may be an integrated circuit. In the third aspect, the DC-DC charge pump may include a first oscillator supplied directly by the output of the AC-DC charge pump; a second oscillator supplied by a voltage across a capacitor; and an oscillator selection logic circuitry configured to select, based on a voltage level of the output of the AC-DC charge pump, between a signal from the first oscillator and a signal from the second oscillator to clock components of the DC-DC charge pump. In the third aspect, the oscillator selection logic circuitry may be configured such that, when the second oscillator is selected, the voltage across the capacitor is lower than a voltage of the output of the AC-DC charge pump. In the third aspect, the capacitor may be part of the integrated circuit. In the third aspect, the capacitor may be charged from the output of the AC-DC charge pump. In the third aspect, the AC-DC charge pump may be a Cockcroft Walton charge pump. In the third aspect, the DC-DC charge pump may be a Dickson charge pump. In the third aspect, the DC-DC charge pump may be a Cockcroft Walton charge pump.

In a fourth aspect, the subject matter described in this specification can be embodied in an apparatus that includes an AC-DC charge pump; a DC-DC charge pump. The DC-DC charge pump includes a first oscillator supplied directly by an output of the AC-DC charge pump; a second oscillator supplied by a voltage across a capacitor; and an oscillator selection logic circuitry configured to select, based on a voltage level of the output of the AC-DC charge pump, between a signal from the first oscillator and a signal from the second oscillator to clock components of the DC-DC charge pump.

In the fourth aspect, the apparatus may be an integrated circuit. In the fourth aspect, the oscillator selection logic circuitry may be configured such that, when the second oscillator is selected, the voltage across the capacitor is lower than a voltage of the output of the AC-DC charge pump. In the fourth aspect, the capacitor may be charged from the output of the AC-DC charge pump. In the fourth aspect, the capacitor may be part of the integrated circuit. In the fourth aspect, the AC-DC charge pump may be a Cockcroft Walton charge pump. In the fourth aspect, the DC-DC charge pump may be a Dickson charge pump. In the fourth aspect, the DC-DC charge pump may be a Cockcroft Walton charge pump.

In a fifth aspect, the subject matter described in this specification can be embodied in an apparatus that includes a comparator with an input node connected to a lowest voltage stage of the charge pump; and a switch connected between the input node and a ground node.

In the fifth aspect, the apparatus may be an integrated circuit. In the fifth aspect, the apparatus may be a charge pump. In the fifth aspect, the charge pump may be an AC-DC charge pump, and the switch may be an NMOS transistor with a gate terminal connected to an output node of a DC-DC charge pump, a source terminal connected to the ground node, and a drain terminal connected to the input node. The DC-DC charge pump may take an output of the AC-DC charge pump as input.

In a sixth aspect, the subject matter described in this specification can be embodied in an apparatus that includes a comparator including a first current source that draws current from an output of the AC-DC charge pump and a second current source that draws current from an output of a DC-DC charge pump. The DC-DC charge pump takes the output of the AC-DC charge pump as input.

In the sixth aspect, the apparatus may be an integrated circuit. In the sixth aspect, the apparatus may be an AC-DC charge pump. In the sixth aspect, the second current source may include a PMOS transistor with a gate terminal connected to a bias voltage node, a source terminal connected to the output of the DC-DC charge pump, and a drain terminal connected to an output node of the comparator. In the sixth aspect, the AC-DC charge pump may be a Cockcroft Walton charge pump. In the sixth aspect, the DC-DC charge pump may be a Dickson charge pump. In the sixth aspect, the DC-DC charge pump may be a Cockcroft Walton charge pump. In the sixth aspect, an input node of the AC-DC charge pump may be coupled to a piezo electric energy harvester in a sensor-based orthotic configured detect signals indicative of ulcer formation occurring in a shoe.

In a seventh aspect, the subject matter described in this specification can be embodied in a method that includes supplying an output of an AC-DC charge pump directly to a first oscillator; supplying a voltage across a capacitor to a second oscillator; and selecting, based on a voltage level of the output of the AC-DC charge pump, between a signal from the first oscillator and a signal from the second oscillator to clock components of a DC-DC charge pump.

In the seventh aspect, when the second oscillator is selected, the voltage across the capacitor is lower than a voltage of the output of the AC-DC charge pump. In the seventh aspect, the capacitor may be charged from the output of the AC-DC charge pump. In the seventh aspect, the AC-DC charge pump may be a Cockcroft Walton charge pump. In the seventh aspect, the DC-DC charge pump may be a Dickson charge pump. In the seventh aspect, the DC-DC charge pump may be a Cockcroft Walton charge pump.

In an eighth aspect, the subject matter described in this specification can be embodied in a method that includes supplying a voltage from an AC-DC charge pump to an input node of a comparator; and selectively holding down the voltage at the input node of the comparator when an output of the AC-DC charge pump is above a threshold voltage.

In the eighth aspect, the input node of the comparator may be connected to a lowest voltage stage of the AC-DC charge pump. In the eighth aspect, the AC-DC charge pump may take input voltage from a piezo electric harvester in an orthotic shoe. In the eighth aspect, the method may include supplying the output of the AC-DC charge pump directly to a first oscillator; supplying a voltage across a capacitor to a second oscillator; and selecting, based on a voltage level of the output of the AC-DC charge pump, between a signal from the first oscillator and a signal from the second oscillator to clock components of a DC-DC charge pump. In the eighth aspect, when the second oscillator is selected, the voltage across the capacitor is lower than a voltage of the output of the AC-DC charge pump. In the eighth aspect, the capacitor may be charged from the output of the AC-DC charge pump. In the eighth aspect, the DC-DC charge pump may be a Dickson charge pump. In the eighth aspect, the DC-DC charge pump may be a Cockcroft Walton charge pump. In the eighth aspect, the AC-DC charge pump may be a Cockcroft Walton charge pump.

While the disclosure has been described in connection with certain embodiments, it is to be understood that the disclosure is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures.

What is claimed is:

1. An apparatus comprising:
   a first PMOS transistor with a gate terminal connected to a bias voltage node, a source terminal connected to an output of an AC-DC charge pump, and a drain terminal connected to a first node;
   a second PMOS transistor with a gate terminal connected to the bias voltage node, a source terminal connected to the output of the AC-DC charge pump, and a drain terminal connected to an output node;
   a first NMOS transistor with a gate terminal connected to the first node, a source terminal connected to a first input node, and a drain terminal connected to the first node;
   a second NMOS transistor with a gate terminal connected to the first node, a source terminal connected to a second input node, and a drain terminal connected to the output node; and
   a switch connected between the second input node and a ground node.

2. The apparatus of claim 1, wherein the switch is an NMOS transistor with a gate terminal connected to an output node of a DC-DC charge pump, a source terminal connected to the ground node, and a drain terminal connected to the second input node, wherein the DC-DC charge pump takes the output of the AC-DC charge pump as input.

3. The apparatus of claim 1, wherein the second input node is connected to a lowest voltage stage of the AC-DC charge pump.

4. The apparatus of claim 1, wherein the switch is configured to enter a conducting state to hold down a voltage at the second input node when the output of the AC-DC charge pump is above a threshold.

5. The apparatus of claim 1, comprising:
   a capacitor connected between the gate terminal of the second NMOS transistor and the output node.

6. The apparatus of claim 1, comprising:
   a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input.

7. The apparatus of claim 1, comprising:
   a third PMOS transistor with a gate terminal connected to the bias voltage node, a source terminal connected to an output of a DC-DC charge pump, and a drain terminal connected to the output node, wherein the DC-DC charge pump takes the output of the AC-DC charge pump as input.

8. The apparatus of claim 1, comprising:
   a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input; and
   a fourth PMOS transistor with a gate terminal connected to the bias voltage node, a source terminal connected to the output of the DC-DC charge pump, and a drain terminal connected to the output node.

9. The apparatus of claim 1, comprising:
   a DC-DC charge pump with an output that controls the switch, wherein the DC-DC charge pump includes:
   a first oscillator supplied directly by the output of the AC-DC charge pump;
   a second oscillator supplied by a voltage across a capacitor; and
   an oscillator selection logic circuitry configured to select, based on a voltage level of the output of the AC-DC charge pump, between a signal from the first oscillator and a signal from the second oscillator to clock components of the DC-DC charge pump.

10. The apparatus of claim 9, wherein the oscillator selection logic circuitry is configured such that, when the second oscillator is selected, the voltage across the capacitor is lower than a voltage of the output of the AC-DC charge pump.

11. The apparatus of claim 9, wherein the capacitor is charged from the output of the AC-DC charge pump.

12. The apparatus of claim 9, wherein the DC-DC charge pump is a Dickson charge pump.

13. An integrated circuit comprising:
   a first PMOS transistor with a gate terminal connected to a bias voltage node, a source terminal connected to an output of an AC-DC charge pump, and a drain terminal connected to a first node;
   a second PMOS transistor with a gate terminal connected to the bias voltage node, a source terminal connected to the output of the AC-DC charge pump, and a drain terminal connected to an output node;
   a first NMOS transistor with a gate terminal connected to the first node, a source terminal connected to a first input node, and a drain terminal connected to the first node;
   a second NMOS transistor with a gate terminal coupled to the output node, a source terminal connected to a second input node, and a drain terminal connected to the output node; and
   a third PMOS transistor with a gate terminal connected to the bias voltage node, a source terminal connected to an output of a DC-DC charge pump, and a drain terminal connected to the output node, wherein the DC-DC charge pump takes the output of the AC-DC charge pump as input.

14. The integrated circuit of claim 13, comprising:
a fourth PMOS transistor with a gate terminal connected to the bias voltage node, a source terminal connected to the output of the DC-DC charge pump, and a drain terminal connected to the first node.

15. The integrated circuit of claim 13, wherein the DC-DC charge pump comprises:
a first oscillator supplied directly by the output of the AC-DC charge pump;
a second oscillator supplied by a voltage across a capacitor; and
an oscillator selection logic circuitry configured to select, based on a voltage level of the output of the AC-DC charge pump, between a signal from the first oscillator and a signal from the second oscillator to clock components of the DC-DC charge pump.

16. The integrated circuit of claim 15, wherein the oscillator selection logic circuitry is configured such that, when the second oscillator is selected, the voltage across the capacitor is lower than a voltage of the output of the AC-DC charge pump.

17. An integrated circuit comprising:
a first PMOS transistor with a gate terminal connected to a bias voltage node, a source terminal connected to an output of an AC-DC charge pump, and a drain terminal connected to a first node;
a second PMOS transistor with a gate terminal connected to the bias voltage node, a source terminal connected to the output of the AC-DC charge pump, and a drain terminal connected to an output node;
a first NMOS transistor with a gate terminal connected to the first node, a source terminal connected to a first input node, and a drain terminal connected to the first node;
a second NMOS transistor with a gate terminal coupled to the output node, a source terminal connected to a second input node, and a drain terminal connected to the output node; and
a third PMOS transistor with a gate terminal connected to the bias voltage node, a source terminal connected to an output of a DC-DC charge pump, and a drain terminal connected to the first node, wherein the DC-DC charge pump takes the output of the AC-DC charge pump as input.

18. The integrated circuit of claim 17, wherein the DC-DC charge pump comprises:
a first oscillator supplied directly by the output of the AC-DC charge pump;
a second oscillator supplied by a voltage across a capacitor; and
an oscillator selection logic circuitry configured to select, based on a voltage level of the output of the AC-DC charge pump, between a signal from the first oscillator and a signal from the second oscillator to clock components of the DC-DC charge pump.

19. The integrated circuit of claim 18, wherein the oscillator selection logic circuitry is configured such that, when the second oscillator is selected, the voltage across the capacitor is lower than a voltage of the output of the AC-DC charge pump.

20. The integrated circuit of claim 18, wherein the capacitor is part of the integrated circuit.

* * * * *